(12) United States Patent
Refai-Ahmed et al.

(10) Patent No.: US 7,623,349 B2
(45) Date of Patent: Nov. 24, 2009

(54) THERMAL MANAGEMENT APPARATUS AND METHOD FOR A CIRCUIT SUBSTRATE

(75) Inventors: Gamal Refai-Ahmed, Markham (CA); John Shaw, Newmarket (CA); Adrian Fung, Toronto (CA)

(73) Assignee: ATI Technologies ULC, Markham, Ontario (CA)

( * ) Notice: Subject to any disclaimer, the term of this patent is extended or adjusted under 35 U.S.C. 154(b) by 505 days.

(21) Appl. No.: 10/906,795

(22) Filed: Mar. 7, 2005

(65) Prior Publication Data

US 2006/0198108 A1 Sep. 7, 2006

(51) Int. Cl.
*H05K 7/20* (2006.01)

(52) U.S. Cl. .................. 361/719; 361/704; 361/708; 257/707; 174/252

(58) Field of Classification Search .............. 361/719, 361/708, 687, 676, 706, 818, 728; 174/102 R, 174/36; 200/5 A; 427/96.3
See application file for complete search history.

(56) References Cited

U.S. PATENT DOCUMENTS

| | | | |
|---|---|---|---|
| 5,014,904 A | | 5/1991 | Morton |
| 5,181,167 A | | 1/1993 | Davidson et al. |
| 5,223,739 A | * | 6/1993 | Katsumata et al. .......... 257/676 |
| 5,293,001 A | * | 3/1994 | Gebs ......................... 174/36 |
| 5,390,078 A | | 2/1995 | Taylor |
| 5,396,403 A | * | 3/1995 | Patel ......................... 361/705 |
| 5,550,711 A | * | 8/1996 | Burns et al. ................. 361/728 |
| 5,557,500 A | * | 9/1996 | Baucom et al. ............. 361/687 |
| 5,754,401 A | | 5/1998 | Saneinejad et al. |
| 5,812,374 A | | 9/1998 | Shuff |
| 5,986,887 A | | 11/1999 | Smith |
| 6,005,191 A | * | 12/1999 | Tzeng et al. ............. 174/102 R |
| 6,049,469 A | * | 4/2000 | Hood et al. ................. 361/818 |
| 6,094,344 A | * | 7/2000 | Nakagawa et al. .......... 361/687 |
| 6,101,094 A | | 8/2000 | Kermaani et al. |
| 6,151,215 A | | 11/2000 | Hoffman |
| 6,157,538 A | * | 12/2000 | Ali et al. .................... 361/704 |
| 6,330,156 B1 | | 12/2001 | Cresse |
| 6,399,903 B1 | * | 6/2002 | Stevenson .................. 200/5 A |
| 6,646,890 B1 | | 11/2003 | Byers et al. |
| 6,654,250 B1 | * | 11/2003 | Alcoe ........................ 361/719 |
| 6,671,173 B2 | | 12/2003 | Ashiya et al. |
| 6,697,257 B1 | * | 2/2004 | Wolf et al. ................. 361/708 |

(Continued)

OTHER PUBLICATIONS

Therm-A-Gap T630—Thermally Conductive Form-in-Place Gap Filler, Chomerics Tech Bulletin—T630/630G, 2 pgs. Woburn, MA USA.

(Continued)

*Primary Examiner*—Jayprakash N Gandhi
*Assistant Examiner*—Courtney Smith
(74) *Attorney, Agent, or Firm*—Vedder Price P.C.

(57) ABSTRACT

The present disclosure relates to thermal management apparatus for a circuit substrate having heat generating components mounted on one or both sides thereof. The apparatus and method includes a circuit assembly having a first thermally conductive layer disposed on each side of the circuit substrate and being thermally coupled to one or more heat generating components of the circuit substrate. The apparatus and method includes a second thermally conductive layer disposed on each side of the circuit substrate and being thermally coupled to the first thermally conductive layer. The first thermally conductive layer and the thermally conductive layer can be shaped, sized, and/or configured to provide cooling of the one or more heat generating components disposed on each side of the circuit substrate by transferring and spreading the heat to the outside of the circuit assembly.

15 Claims, 2 Drawing Sheets

U.S. PATENT DOCUMENTS

| | | |
|---|---|---|
| 6,807,061 B1 | 10/2004 | Harris |
| 6,816,378 B1 | 11/2004 | Belady et al. |
| 6,819,562 B2 | 11/2004 | Boudreaux et al. |
| 6,909,602 B2 * | 6/2005 | Dietrich et al. .............. 361/687 |
| 7,030,482 B2 * | 4/2006 | Haines ....................... 257/706 |
| 7,106,588 B2 * | 9/2006 | Oberlin et al. .............. 361/700 |
| 2005/0202158 A1 * | 9/2005 | Millas et al. ............... 427/96.3 |

OTHER PUBLICATIONS

Therm-A-Gap 570 & 580—Thermally Conductive Gap Fillers, Chomerics, May 2004, 2 pgs., Woburn, MA USA.

Heat Spreaders—T-Wing and C-Wing Heat Spreaders, Chomerics, Oct. 1999, 6 pgs., Woburn, MA USA.

* cited by examiner

THERMAL MANAGEMENT APPARATUS AND METHOD FOR A CIRCUIT SUBSTRATE

FIELD OF THE INVENTION

The present invention generally relates to thermal management of electronic components, and more particularly, to a thermal management apparatus and method for a circuit substrate.

BACKGROUND OF THE INVENTION

Electronic components such as integrated chips generally produce heat when operating. The heat is then transferred to an object to which the electronic component is attached and/or to the surrounding air. However, cooling solutions may be necessary for certain electronic components to maintain the operational temperature thereof below a critical temperature, which if reached, the electronic component may either not operate efficiently or fail due to heat damage. Various known cooling solutions for such electronic components can be used. For example, a heat sink that is typically constructed with copper can be attached to the outer surface of the electronic component with a thermally conductive adhesive. The heat generated by the electronic component is then transferred by conduction to the copper heat sink through the adhesive. The copper heat sink then transfers the heat to the surrounding air by convection. To provide additional cooling, a fan may also be placed near or on the copper heat sink to increase the air flow near and inside the structure of the heat sink to increase the heat transfer by convention.

Air cooling, however, fails to provide adequate cooling for certain electronic devices that use heat generating components. In small electronic devices or certain electronic devices, the internal space between the various components may be limited. Accordingly, even if a copper heat sink is used with or without a fan to cool a heat generating component, the limited space in the electronic device does not provide proper air circulation for the cooling of the heat generating component. This problem is further amplified in certain electronic devices where circuit substrates having heat generating components mounted thereon may be stacked on top of each other. Furthermore, cooling electronic components mounted on stacked circuit substrates becomes yet a bigger issue when one or more of the stacked substrates are double-sided, i.e., include heat generating components on both sides thereof. Although spacers can be provided between the stacked substrates to distance the substrates from each other to provide air gaps, such air gaps may not be sufficient to provide adequate air flow to cool the components that are positioned between a pair of stacked circuit substrates.

Various solutions to the above-described problem of cooling stacked substrates exist. However, most of these solutions solve the problem of cooling only single-sided stacked substrates, which are substrates that include heat generating components mounted only on one side of the substrate. One solution for cooling a double-side stacked substrates is to provide various heat conductive paths from each circuit substrate that connect to a heat sink which is disposed on top of the stack of substrates. However, this solution does not address the problem of limited air flow between the stacked substrates to cool the heat generating components. Additionally, in certain electronic devices where space is limited the noted solution occupies a relatively large volume due to the presence of the heat sink. Therefore, none of the solutions solve the problem of having single-sided or double-sided stacked substrates with adequate cooling provided and implemented in electronic devices where space is limited.

Therefore, there is a need for a cooling solution for single-sided or double-sided stacked substrates that can be implemented in electronic devices where space is limited.

BRIEF DESCRIPTION OF THE DRAWINGS

The features of the present invention which are believed to be novel are set forth with particularity in the appended claims. The invention may best be understood by reference to the following description taken in conjunction with the accompanying drawings, and the several figures of which like reference numerals identify like elements.

DETAILED DESCRIPTION OF A PREFERRED EMBODIMENT

The present disclosure relates to thermal management apparatus for a circuit substrate having heat generating components mounted on one or both sides thereof. The apparatus and method includes a circuit assembly having a first thermally conductive layer disposed on each side of the circuit substrate and being thermally coupled to one or more heat generating components of the circuit substrate. The apparatus and method includes a second thermally conductive layer disposed on each side of the circuit substrate and being thermally coupled to the first thermally conductive layer. The first thermally conductive layer and the thermally conductive layer can be shaped, sized, and/or configured to provide cooling of the one or more heat generating components disposed on each side of the circuit substrate by transferring and spreading the heat to the outside of the circuit assembly.

Figure 1:
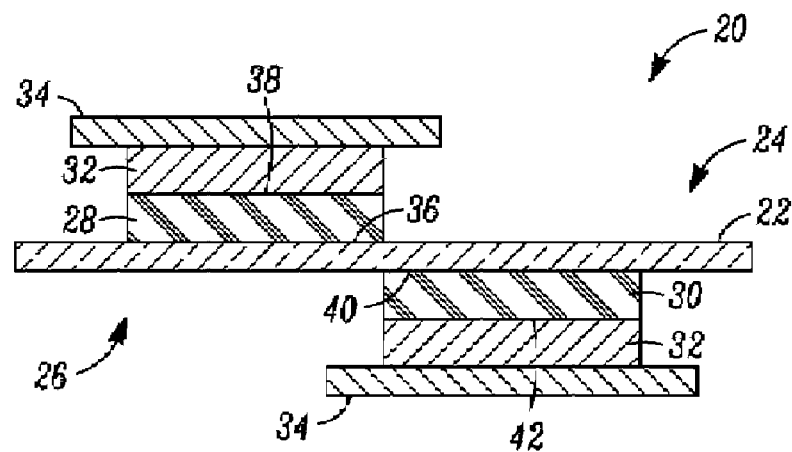
FIG. 1 is a cross-sectional view of an example of a circuit assembly constructed in accordance with the teachings of the present disclosure.

Referring to FIG. 1, one embodiment of a circuit assembly 20 constructed in accordance with the teachings of the present disclosure is shown. The circuit assembly 20 includes a circuit substrate 22 having a first side 24 and a second side 26, which are also used herein to generally refer to the first side and the second side of the circuit assembly 20. The circuit assembly 20 includes at least one heat generating component 28 disposed on the first side 24 of the circuit substrate 22 and at least one heat generating component 30 disposed on the second side 26 of the circuit substrate 22. The circuit assembly 20 also includes a first thermally conductive layer 32 on each of the first side 24 and the second side 26 of the circuit substrate 22 that is thermally coupled to the heat generating components 28 and 30, respectively. The circuit assembly 20 further includes a second thermally conductive layer 34 that is thermally coupled to first thermally conductive layer 30. Accordingly, the heat generated by the heat generating components 28 and 30 is spread and transferred through the first thermally conductive layer 32 to the second thermally conductive layer 34. The second thermally conductive layer 34 spreads and transfers the heat either to an object to which it is thermally coupled, or to the air surrounding the circuit assembly 20 by convection.

Each heat generating component 28 and 30 is mounted on the circuit substrate 22 and may be an application specific integrated chip or any other electronic or optical component that produces heat when operating. The circuit substrate 22 may be constructed from any suitable materials that can provide an electronic or optic circuit structure and support a variety of electronic or optic components. For example, the circuit substrate 22 can be a printed circuit board, a ceramic circuit board, or other types of circuit substrates that are known in the art.

The heat generating component 28 includes a mounting surface 36 and an outer surface 38. When mounted on the circuit substrate 22, the mounting surfaces 36 may be near or in contact with the circuit substrate 22. The entire outer surface 38 or any desired portion thereof may be contacting the first thermally conductive layer 32. Similarly, the heat generating component 30 includes a mounting surface 40 and an outer surface 42. When mounted on the circuit substrate 22, the mounting surface 40 may be near or in contact with the circuit substrate 22. The entire outer surface 42 or any desired portion thereof may be contacting the first thermally conductive layer 32. During the operation of the heat generating components 28 and 30, the heat generated in the heat generating components 28 and 30 transfers to the mounting surfaces 36 and 40, and the outer surfaces 38 and 42, respectively. The mounting surfaces 36 and 40 transfer the heat to the circuit substrate 22, while each of the outer surfaces 38 and 42 transfers the heat either to the first thermally conductive layer 32 by conduction, and/or to the surrounding air by convection.

The first thermally conductive layer 32 may be in contact with all or portions of the outer surfaces 38 and 42. One of ordinary skill in the art will readily appreciate that the larger a contact area between the outer surfaces 38 and 42 and first thermally conductive layer 30, the more heat can be transferred from the outer surfaces 38 and 42 to the first thermally conductive layer 32. Additionally, the first thermally conductive layer 32 may be more heat conductive than air. Accordingly, the amount of heat transfer from the outer surfaces 38 and 42 of each of the heat generating components 28 and 30 to the first thermally conductive layer 32 may be controllable based on the size of the contact area between the outer surfaces 38 and 42 and the first thermally conductive layer 32.

Figure 2:
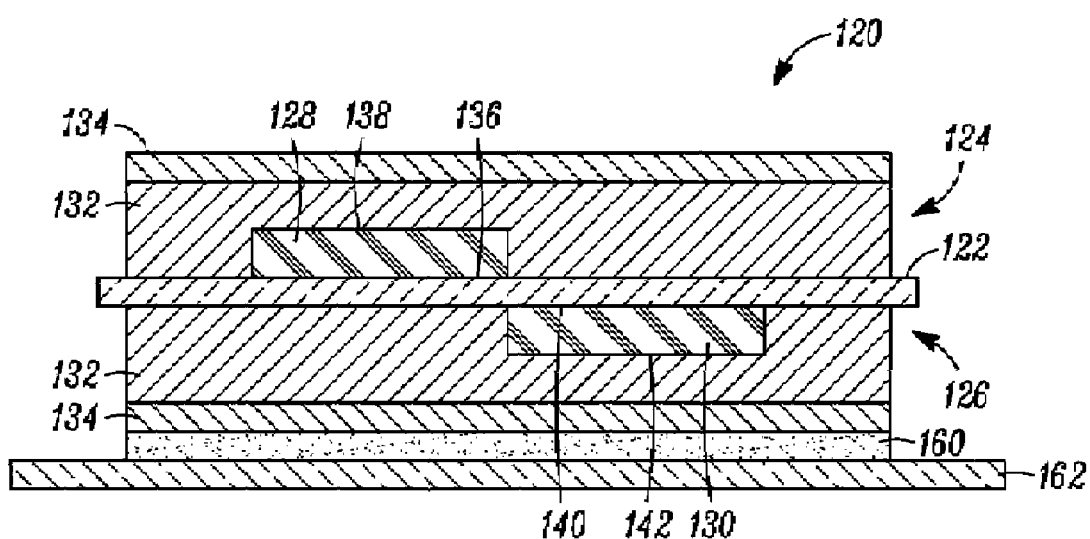
FIG. 2 is a cross-sectional view of another example of a circuit assembly constructed in accordance with the teachings of the present disclosure

Referring to FIG. 2, another embodiment of a circuit assembly 120 constructed in accordance with the teachings of the present disclosure is shown. The circuit assembly 120 includes a circuit substrate 122 having a first side 124 and a second side 126, which are also used herein to generally refer to the first side and the second side of the circuit assembly 120. The circuit assembly 120 includes at least one heat generating component 128 disposed on the first side 124 of the circuit substrate 122 and at least one heat generating component 130 disposed on the second side 126 of the circuit substrate 122. The circuit assembly 120 also includes a first thermally conductive layer 132 on each of the first side 124 and the second side 126 of the circuit substrate 122 that is thermally coupled to the heat generating components 128 and 130, respectively. The circuit assembly 120 further includes a second thermally conductive layer 134 that is thermally coupled to first thermally conductive layer 130. Accordingly, the heat generated by the heat generating components 128 and 130 is transferred through the first thermally conductive layer 130 to the second thermally conductive layer 134. The second thermally conductive layer 134 transfers the heat either to an object to which it is thermally coupled, or to the air surrounding the circuit assembly 120 by convection.

Although not shown in FIG. 2, the circuit substrate 122 may only include heat generating components on only one side thereof. For example, the circuit substrate 122 may only include the heat generating component 128 on the first side 124. Accordingly, the first thermally conductive layer 132 on the first side 124 can be thermally coupled to both the heat generating component 128 and the first side 124 of the circuit substrate 122. The first thermally conductive layer 132 on the second side 126 can be thermally coupled to the second side 126. The heat generated by the heat generating component 128 is then transferred through the first thermally conductive layer 132 of the first side 124 to the second thermally conductive layer 134. The heat generated by the heat generating component 128 is also transferred through the circuit substrate 122 to the first thermally conductive layer 132 of the second side 126. The second thermally conductive layer 134 then transfers the heat either to an object to which it is thermally coupled, or to the air surrounding the circuit assembly 120 by convection. Therefore, the present disclosure is applicable to circuit substrates with heat generating components on only one side or on both sides thereof.

The heat generating component 128 includes a mounting surface 136 and an outer surface 138. When mounted on the circuit substrate 122, the mounting surface 136 may be near or in contact with the circuit substrate 122. As shown in FIG. 2, the outer surface 138 may be fully in contact with the first thermally conductive layer 132. Similarly, when mounted on the circuit substrate 122, the mounting surface 140 may be near or in contact with the circuit substrate 122. As shown in FIG. 2, the outer surface 142 may be fully in contact with the first thermally conductive layer 132. During the operation of the heat generating components 128 and 130, the heat generated transfers to the mounting surfaces 136 and 140, and the outer surfaces 138 and 142, respectively. The mounting surfaces 136 and 140 transfer the heat to the circuit substrate 122, while each of the outer surfaces 138 and 142 transfers the heat to the first thermally conductive layer 132 by conduction.

The first thermally conductive layers 132 may be deformable so that when contacting the circuit substrate 122, they substantially conform to the outer surfaces 138 and 142 of the heat generating components 128 and 130. Alternatively, inner surfaces of the first thermally conductive layer 132 that contact the circuit substrate 122 may be embossed or shaped to include a negative image of the corresponding side of the circuit substrate 122. Accordingly, when the first thermally conductive layer 132 is placed or mounted on the circuit substrate 122, it may complementarily contact the outer surfaces 138 and 142 of the heat generating components and may contact the surfaces of the circuit substrate 122.

As shown in FIG. 2, the first thermally conductive layer 132 substantially contacts the outer surfaces 138 and 142. Additionally, the first thermally conductive layer 132 can be sized to contact the circuit substrate 122. Accordingly, the heat from the heat generating components 128 and 130 and the heat transferred by the heat generating components 128 and 130 that is transferred to the circuit substrate, can be transferred to the first thermally conductive layer 132. The heat can spread throughout the first thermally conductive layer 132. The second thermally conductive layer 134 may be sized and shaped to contact all or substantially large portions of the first thermally conductive layer 132. Accordingly, the second thermally conductive layer 134 can provide heat transfer from the first thermally conductive layer 132 to the outside of the circuit assembly 120. Additionally, the larger the contact surface area between the first thermally conductive layer 132 and the second thermally conductive layer 134, the more heat may be transferred from the first thermally conductive layer 132 to the second thermally conductive layer 134.

Figure 3:
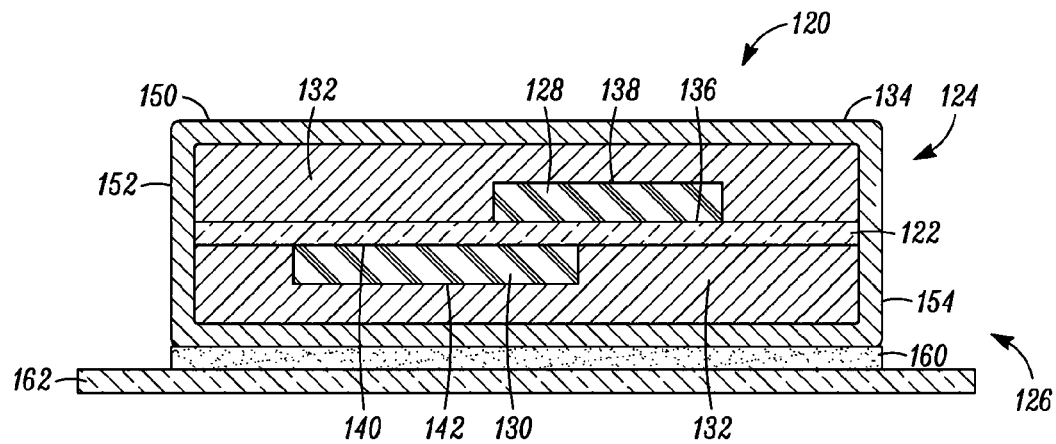
FIG. 3 is a side cross-sectional view of the circuit assembly of FIG. 2.

Referring now to FIG. 3, a side cross sectional view of the circuit assembly 120 of FIG. 2 is shown. The second thermally conductive layer 134 surround the circuit substrate 122 and the first thermally conductive layer 132 to form an enclosure 150. The enclosure 150 includes a first side wall 152 and a second side wall 154, which can cover and be in contact with the sides of the thermally conductive layer 132. Accordingly, the first side wall 152 and the second side wall 154 can facilitate heat transfer even from the corresponding sides of the first thermally conductive layer 132 to the outside of the circuit assembly 120.

Figure 4:
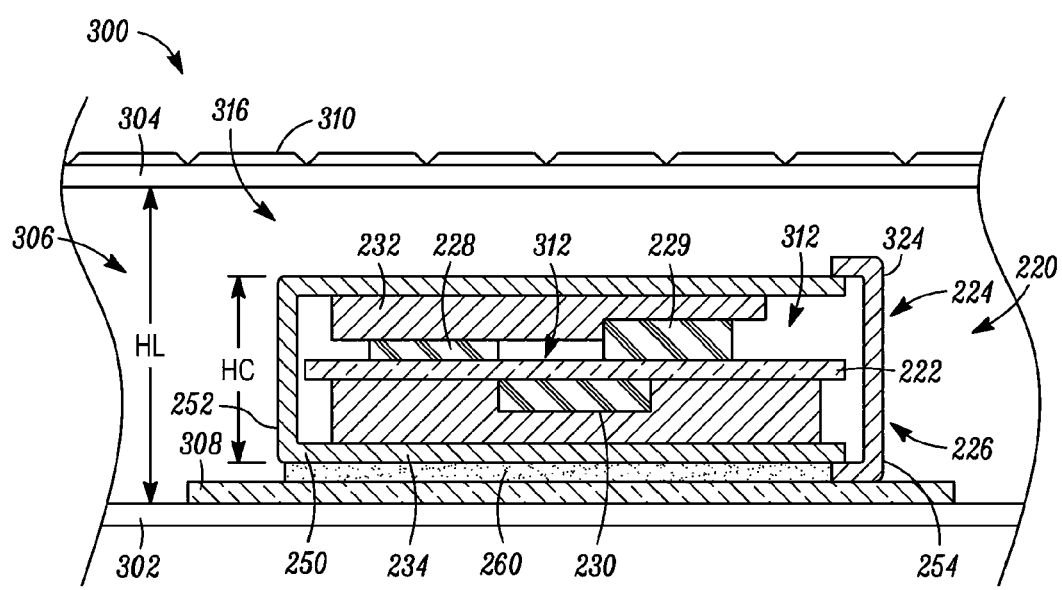
FIG. 4 is a cross-sectional view of another example of a circuit assembly constructed in accordance with the teachings of the present disclosure and illustrated as being implemented in a laptop computer.

The size and shape of the first thermally conductive layer 32,132 and the second thermally conductive layer 34,134 may be dictated by the size of the circuit substrate 22,122 and the application for which the circuit substrate 22,122 is used, respectively. Additionally, the method of assembly of the circuit substrate 22,122 with the first thermally conductive layer 32,132 and the second thermally conductive layer 34,134 may also be dictated by the shapes, sizes and the materials used for the first thermally conductive layer 32,132 and the second thermally conductive layer 34,134. For example, referring to FIG. 1, the first thermally conductive layer 32 may simply be a pad constructed from a thermally conductive material that can be attached to each of the heat generating components 28 and 30 with a thermally conductive adhesive (not shown). Similarly, the second thermally conductive layer 34 can be the same or larger sized pad to connect with and cover the first thermally conductive layer 32. The second thermally conductive layer 34 can also be attached to the first thermally conductive layer 32 with a thermally conductive adhesive (not shown). Referring to FIG. 4, the enclosure 150 of the circuit assembly 120 can be constructed prior to assembling the circuit assembly 120. Accordingly, after the first thermally conductive layers 132 are attached to the corresponding sides of the circuit substrate 122, circuit substrate 122 and the first conductive layer 132 can be inserted in the enclosure 150 and secured thereto with a thermally conductive adhesive.

As described in the foregoing, the first thermally conductive layer 132 may be constructed from a deformable material so that when it is attached to the first side 124 or the second side 126 of the circuit substrate 122 it conforms to the outer sides 138 and 142 of the heat generating components 128 and 130, respectively. The first thermally conductive layer 132 may be constructed from a material that is either heat conducting or includes heat conducting particles evenly distributed therein. An example of such a material that can be used for the first thermally conductive layer 132 is Therm-A-Gap™ 570 & 580, manufactured by Chomerics, a Division of Parker Hannifin Corporation, Woburn, Mass. If the first thermally conductive layer 132 is not deformable, then a negative image of a corresponding side of the circuit substrate 122 can be created by etching, embossing, or other methods in the first thermally conductive layer 132. Accordingly, when the first thermally conductive layer 132 is attached to circuit substrate 122, it substantially conforms to the surface of this circuit substrate 122. The first thermally conductive layer 132 can be attached to the circuit substrate 122 with a thermally conductive adhesive. Alternatively, the enclosure 150 may hold the first thermally conductive layer 132 in a contact position with the circuit substrate 122 when installed over the first thermally conductive layer 132.

The height of the first thermally conductive layer 132 may be determined so as to be able to cover all or portions of the heat generating components 128 and 130 if desired. For example, the height of the first thermally conductive layer 132 may be larger that the height of the tallest heat generating component on the circuit substrate 122. Accordingly, such a first thermally conductive layer can cover the tallest heat generating component of the circuit substrate. In yet another example, the first thermally conductive layer 132 may only contact a side of a heat generating component. Accordingly, the height of such a first thermally conductive layer 132 may be less or equal to the corresponding heat generating component. Therefore, the first thermally conductive layer 132 may be vertically sized to contact any heat generating component of the circuit substrate 122 as desired, and/or to accommodate the surface irregularities or other components of the circuit substrate 122 when contacting the circuit substrate 122.

The second thermally conductive layer 134 contacts an outer surface of the first thermally conductive layer 132. The second thermally conductive layer 134 may have a flat inner surface for contact with the outer surface of the first thermally conductive layer 132 Accordingly, the second thermally conductive layer 134 may be in the shape of a thin flat sheet that includes the disclosed thermal conductivity and heat spreading properties. The second thermally conductive layer 134 may be constructed from a thin sheet of copper, which may be referred to herein as the copper core. To provide electrical insulation for the second thermally conductive layer 134, the copper core is enveloped by an outer layer that is constructed with a material that is not electrically conductive but is thermally conductive. Therefore, the second thermally conductive layer 134 includes a thermally conductive core surrounded by an electrically insulative material. An example of such a second thermally conductive layer is a T-Wing® flexible heat spreader, manufactured by Chomerics, a Division of Parker Hannifin Corporation, Woburn, Mass.

The second thermally conductive layer 134 may be rigid and can be attached to the first thermally conductive layer 132 with a thermally conductive adhesive. However, because the above-described second thermally conductive layer 134 is constructed with a thin sheet of copper, it is flexible so that it can be constructed in the shape of the enclosure 150, or wrapped around the first thermally conductive layer 132 to form an enclosure similar to the enclosure 150.

The circuit assembly 120 can be supported by being mounted to a support surface 162 with a thermal filler 160. The thermal filler 160 can provide continuous heat transfer between the second thermally conductive layer 134 and the support surface 162. Additionally, the thermal filler 160 may serve as an adhesive to securely attach the circuit assembly 120 to the support surface 162. Accordingly, in the disclosed examples, attaching the circuit assembly 120 to the support surface 162 with fasteners or other similar assembly structures may not be necessary. The support surface 162 may be another circuit substrate, a support plate inside an electronic device, the enclosure walls of an electronic device, or any other suitable structure. The support surface 162 may also provide a thermal path to transfer the heat from the circuit assembly 120 to other components of an electronic device or to an enclosure of an electronic device for transfer of the heat to the outside of the electronic device. The thermal filler material may be a pliable or gel-like material that is deformable to fill the gaps between the second thermally conductive layer 134 and the support surface 162. An example of such a gap filling material is Therm-A-Gap™ T630, manufactured by Chomerics, a Division of Parker Hannifin Corporation, Woburn, Mass.

The circuit assembly 120 can be used in electronic devices where space is limited such that the heat generating components 128 and 130 of the circuit substrate 122 cannot be sufficiently cooled with air flow, heat sinks, or a combination thereof. Additionally, the circuit assembly 120 may be applicable in devices where the circuit substrate 122 is disposed between one or more additional circuit substrates such that with common cooling methods (e.g., air flow) the heat between two or more circuit substrates cannot be sufficiently dissipated to cool the components of the circuit substrate 122. The circuit assembly 120 can be installed in a space that may have a height that is slightly larger than the height of the circuit assembly 120. The second thermally conductive layer 134 can be attached to any component of a device, the interior walls of a device, or any other component inside the device that can absorb the heat dissipated from the second thermally conductive layer 134.

FIG. 4 illustrates another embodiment of a circuit assembly 220 constructed in accordance with the teachings of the present disclosure. The circuit assembly 220 is shown as an internal component of a laptop or mobile computer 300, which may be referred to herein as the laptop computer 300. The circuit assembly 220 includes a circuit substrate 222 having a first side 224 and a second side 226, which are also used herein to generally refer to the first side and the second side of the circuit assembly 220. The circuit assembly 220 includes two heat generating components 228 and 229 disposed on the first side 224 and one heat generating component 230 disposed on the second side 226. The circuit assembly 220 also includes a first thermally conductive layer 232 on each of the first side 224 and the second side 226 that is thermally coupled to the heat generating components 228, 229 and 230, respectively. The circuit assembly 220 further includes a second thermally conductive layer 234 that is thermally coupled to first thermally conductive layer 232. Accordingly, the heat generated by the heat generating components 228, 229 and 230 is transferred through the first thermally conductive layer 232 to the second thermally conductive layer 234.

The laptop computer 300 includes a bottom surface 302, shown as a lower panel, and a top surface 304, shown as an upper panel, that generally define a housing 306 for the electronic components of the laptop. Laptop computers are generally smaller in size than their desktop counterparts. Accordingly, the internal electronic components of laptop computers are positioned much closer together than a comparable desktop computer. As shown in FIG. 4, the laptop 300 may include a motherboard 308 that is attached to the bottom surface 302. The circuit assembly 220 is shown mounted on the motherboard 308 and substantially occupies the space between the motherboard 308 and the top surface 304. The top surface 304 may include a keyboard 310, or the top surface 304 may itself be the keyboard 310.

As shown in FIG. 4, the thermally conductive layer 232 that is on the first side 224 of the circuit substrate 222 is in contact with a top surface of the heat generating component 228 and with both the top surface and one side of the heat generating component 229. Accordingly, several air gaps 312 are present on the first side of the circuit substrate 222. As discussed above, the larger the contact surfaces are between the first thermally conductive layer 232 and the heat generating components 228 and 229 on the first side 224 of the circuit assembly 220, the more heat can be transferred from the heat generating component 228 and 229 to the second thermally conductive layer 234 on the first side 224 of the circuit assembly 220. However, in certain applications of the disclosed circuit assembly 220, the amount of heat that is transferred to the second thermally conductive layer 234 may have to be restricted to maintain an object to which the second thermally conductive layer 234 is attached or is near below a certain temperature.

As shown in FIG. 4, the keyboard 310 is positioned directly above and near the outer surface of the second thermally conductive layer 234 of the first side 224. Accordingly, to maintain the keyboard 310 at an acceptable temperature for use by an operator of the laptop 300, the size and configuration of the first thermally conductive layer 232 of the first side 224 may be determined accordingly. Therefore, as shown in FIG. 4, the first thermally conductive layer 232 does not contact the entire outer surfaces of the heat generating components 228 and 229, and provides the air gaps 312 on the first side 224. If the first thermally conductive layer 232 were made larger so as to substantially cover the heat generating components 228 and 229 and/or fill the air gaps 312, the keyboard 310 could become too warm and uncomfortable to the touch for the operator of the laptop 300. In addition, the height HC of the circuit assembly 220 is less than the internal height HL of the housing of the laptop 300 to provide an air gap 316 between the keyboard 310 and the second thermally conductive layer 234 of the first side 224. The air gap 316 further controls the transfer of heat from the second thermally conductive layer 234 on the first side 224 to the keyboard 310. Therefore, one of ordinary skill in the art will readily appreciate that the sizes and configurations of the first thermally conductive layer 232, the second conductive layer 234, and the entire circuit assembly 220 can be tailored so that the amount of heat transferred from the circuit assembly 220 can be controlled as desired.

The heat from the heat generating components 228 and 229 are also transferred to the circuit substrate 222, which in turn can transfer the heat to the first thermally conductive layer 232 of the second side 226. As shown in FIG. 4, the first thermally conductive layer 232 is sized and configured to substantially cover the second side 226 of the circuit substrate 222 including the outer surface of the heat generating component 230. Accordingly, the heat transferred to the second side 226 of the circuit assembly 20 may be greater than the heat that is transferred to the first side 224 of the circuit assembly 220.

The second thermally conductive layer 234 of the second side 226 is thermally coupled to the motherboard 308 with a thermal filler 260. The thermal filler 160 can provide continuous heat transfer between the second thermally conductive layer 234 and the mother board 308. Additionally, the thermal filler 260 may serve as an adhesive to securely attach the circuit assembly 220 to the mother board 308. Accordingly, in the disclosed examples, attaching of the circuit assembly 220 to the mother board 308 with fasteners or other similar devices may not be necessary. The thermal filler material may be a pliable or gel-like material that is deformable to fill the gaps between the second thermally conductive layer 234 and the motherboard 308. An example of such a gap filling material is Therm-A-Gap™ T630, manufactured by Chomerics, a Division of Parker Hannifin Corporation, Woburn, Mass. The motherboard is mounted to the bottom surface 302, which transfers the heat to outside the laptop 300.

The second thermally conductive layer 234 may be a C-shaped enclosure 250, as shown in FIG. 4, to also provide transfer of heat from the first thermally conductive layer 232 and the circuit substrate 222 to a first side wall 252 of the enclosure 250. As described in the foregoing, the second thermally conductive layer 234 can include a thin copper core with an outer layer to provide electrical insulation of the copper core. Accordingly, the second thermally conductive layer 234 is flexible and may be shaped as desired. Therefore, a flat sheet of the material that forms the second thermally conductive layer 234 can be bent and wrapped around the first thermally conductive layer 232 of the first side 224 and the second side 226 to form the C-shaped enclosure 250. The enclosure 250 can be secured to the first thermally conductive layer 232 on both sides 224 and 226 with a thermally conductive adhesive. Optionally, to secure the C-shaped enclosure 250 in contact with the first thermally conductive layer 232, a thermally conductive wrapping material 324 (shown with dashed lines) can be wrapped around the enclosure 250 and secured by a thermally conductive adhesive to the enclosure 250. The thermally conductive wrapping material 324 may be constructed from the same material as the enclosure 250 but also include adhesive backing to attach to the enclosure 250. Accordingly, the thermally conductive wrapping material 324 provides transfer of heat from the first thermally conductive layer 232 and the circuit substrate 222 to a second side wall 254.

The first thermally conductive layer 232 and the second thermally conductive layer 234 may also include electromagnetic insulation (EMI) properties. Accordingly when the circuit assembly 120,220 is constructed with the enclosures 150,250 (i.e., enclosures 150,250 forming a Farady cage), respectively, the circuit assembly 20 can also be electromagnetically shielded from any external interferences. Such EMI shielding may be desired or necessary when a circuit assembly 120,220 is installed in a device having limited internal space, such as the laptop 300. Therefore the circuit assembly 120,220 can also provide EMI shielding in devices where the components are tightly installed inside the device such that electromagnetic interference between various internal components maybe an issue.

The invention is not limited to particular details of the apparatus and method depicted and the modifications and applications may be contemplated. Certain other changes may be made in the above-described method and apparatus without departing from the true spirit of the scope of the invention herein involved. It is intended, therefore, that the subject matter in the above depiction should be interpreted as illustrative and not in a limiting sense.

What is claimed is:

1. An electronic device comprising:
    a housing having an upper panel and a lower panel being spaced apart to define a gap, the lower panel at least partially defining a mounting surface;
    a motherboard coupled to the mounting surface;
    a circuit substrate assembly mounted to the motherboard, the circuit substrate assembly comprising:
        a circuit substrate having a first side including at least one heat generating component and a second side;
        a first thermally conductive layer thermally coupled to the first side including at least one heat generating component of the first side and thermally coupled to the second side;
        a second thermally conductive layer thermally coupled to the first thermally conductive layer on each side of the circuit substrate; and
        wherein the circuit substrate is supported on the mounting surface by the second thermally conductive layer being attached to the mounting surface; and
    wherein the circuit substrate assembly is spaced from the upper panel to define an air gap between the circuit substrate assembly and the upper panel.

2. The electronic device of claim 1, wherein the circuit substrate assembly is thermally coupled to the mounting surface.

3. The electronic device of claim 2, further comprising a third thermally conductive material disposed between the mounting surface and the circuit substrate assembly.

4. The electronic device of claim 1, wherein the second thermally conductive layer comprises a copper core and an electrically insulating outer shell.

5. The electronic device of claim 1, the second side of the circuit substrate including at least one heat generating component, wherein the first thermally conductive layer is thermally coupled to the at least one heat generating component of the second side.

6. The electronic device of claim 1, wherein the first thermal layer is elastic to substantially conform to an outer shape of the at least one heat generating component when connected to the at least one heat generating component.

7. The electronic device of claim 1, wherein a contact surface of the first thermal layer of each side of the circuit substrate is shaped to complimentarily connect with the side of the circuit substrate to which the first thermal layer corresponds.

8. The electronic device of claim 1, wherein the second thermally conductive layer partially wraps around the circuit substrate to define an enclosure to substantially cover the first side and the second side of the circuit substrate.

9. The electronic device of claim 8, wherein the enclosure provide electromagnetic insulation for the circuit assembly.

10. A method of heat management for a double sided circuit substrate, the method comprising:
    thermally coupling each side of the circuit substrate to a first thermally conductive layer by connecting at least one heat generating component disposed on each side of the circuit substrate to the first thermally conductive layer, the first thermally conductive layer on each side of the circuit substrate providing a thermal path away from at least one heat generating element on each side of the circuit substrate; and
    thermally coupling the first thermally conductive layer on each side of the circuit substrate with a second thermally conductive layer by connecting the second thermally conductive layer with the first thermally conductive layer forming a circuit substrate assembly; and
    mounting the circuit substrate assembly between an upper and lower surface which form a housing of a device to define a gap between the circuit substrate assembly and the upper surface.

11. The method of claim 10, further comprising mounting the second thermally conductive layer to a support surface, the mounting providing support for the circuit substrate on the support surface, the mounting causing thermal coupling of the second thermally conductive layer and the support surface.

12. The method of claim 10, further comprising:
    wrapping the second thermally conductive layer around the circuit substrate to form an enclosure, the enclosure having the first thermally conductive layer connected to an interior thereof to thermally couple the first thermally conductive layer to the second thermally conductive layer, the wrapping causing thermal coupling of the first thermally conductive layer with each of the heat generating element on each side of the circuit substrate; and
    securing the enclosure around the circuit substrate.

13. The method of claim 10, the enclosure providing electromagnetic insulation for the circuit substrate.

14. The device of claim 1 wherein the upper panel comprises a keyboard.

15. The device of claim 1 wherein the circuit substrate has a second side comprising a heat generating element and wherein an air gap is formed on the first side opposite the heat generating element on the second side by a thermally conductive layer that is in thermal contact with the heat generating device on the first side.

* * * * *

UNITED STATES PATENT AND TRADEMARK OFFICE
CERTIFICATE OF CORRECTION

PATENT NO. : 7,623,349 B2  Page 1 of 1
APPLICATION NO. : 10/906795
DATED : November 24, 2009
INVENTOR(S) : Refai-Ahmed et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 527 days.

Signed and Sealed this

Fourteenth Day of December, 2010

David J. Kappos
*Director of the United States Patent and Trademark Office*